US012646539B2

(12) United States Patent
Haidous

(10) Patent No.: US 12,646,539 B2
(45) Date of Patent: Jun. 2, 2026

(54) POWER-AWARE MEMORY CONTROL

(71) Applicant: Advanced Micro Devices, Inc., Santa Clara, CA (US)

(72) Inventor: Ali Haidous, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 186 days.

(21) Appl. No.: 18/533,922

(22) Filed: Dec. 8, 2023

(65) Prior Publication Data

US 2025/0191619 A1    Jun. 12, 2025

(51) Int. Cl.
| | |
|---|---|
| *G11C 5/14* | (2006.01) |
| *H04N 19/124* | (2014.01) |
| *H04N 19/156* | (2014.01) |
| *H04N 19/167* | (2014.01) |
| *H04N 19/176* | (2014.01) |
| *H04N 19/423* | (2014.01) |

(52) U.S. Cl.
CPC ........... *G11C 5/148* (2013.01); *H04N 19/124* (2014.11); *H04N 19/156* (2014.11); *H04N 19/167* (2014.11); *H04N 19/176* (2014.11); *H04N 19/423* (2014.11)

(58) Field of Classification Search
CPC .... G11C 5/148; H04N 19/124; H04N 19/156; H04N 19/167; H04N 19/176; H04N 19/423
USPC ......................................................... 365/227
See application file for complete search history.

(56) References Cited

U.S. PATENT DOCUMENTS

| | | | |
|---|---|---|---|
| 2012/0244869 A1* | 9/2012 | Song ................. | H04W 52/0206 455/449 |
| 2014/0282626 A1* | 9/2014 | Muguda ................ | H04L 47/781 719/328 |
| 2019/0313024 A1* | 10/2019 | Selinger ........... | G08B 13/19636 |
| 2021/0064113 A1* | 3/2021 | Laurent .............. | G11C 11/2293 |
| 2023/0043775 A1* | 2/2023 | Chen ........................ | G11C 7/20 |
| 2024/0028409 A1* | 1/2024 | Venkatachalam ....... | G06F 9/505 |

* cited by examiner

*Primary Examiner* — Huan Hoang
(74) *Attorney, Agent, or Firm* — Volpe Koenig

(57) ABSTRACT

A technique is provided. The technique includes identifying memory cells, of a set of memory cells to power down, based on a set of priorities for the set of memory cells; powering down the identified memory cells in accordance with the set of priorities, resulting in powered down memory cells; and performing processing in accordance with the powered down memory cells.

20 Claims, 5 Drawing Sheets

100

300

Encoder 520

Decoder 550

600

Identify memory cells to power down

602

Power down identified memory cells

604

Operate memory in accordance with powered down memory cells

606

POWER-AWARE MEMORY CONTROL

BACKGROUND

Computer memory is a large consumer of power in a computing device. Thus, techniques are needed to reduce such power consumption while having a minimal impact on processing results.

BRIEF DESCRIPTION OF THE DRAWINGS

A more detailed understanding may be had from the following description, given by way of example in conjunction with the accompanying drawings wherein.

DETAILED DESCRIPTION

A technique is provided. The technique includes identifying memory cells to power down; powering down the identified memory cells, resulting in powered down memory cells; and performing processing in accordance with the powered down memory cells.

Figure 1:
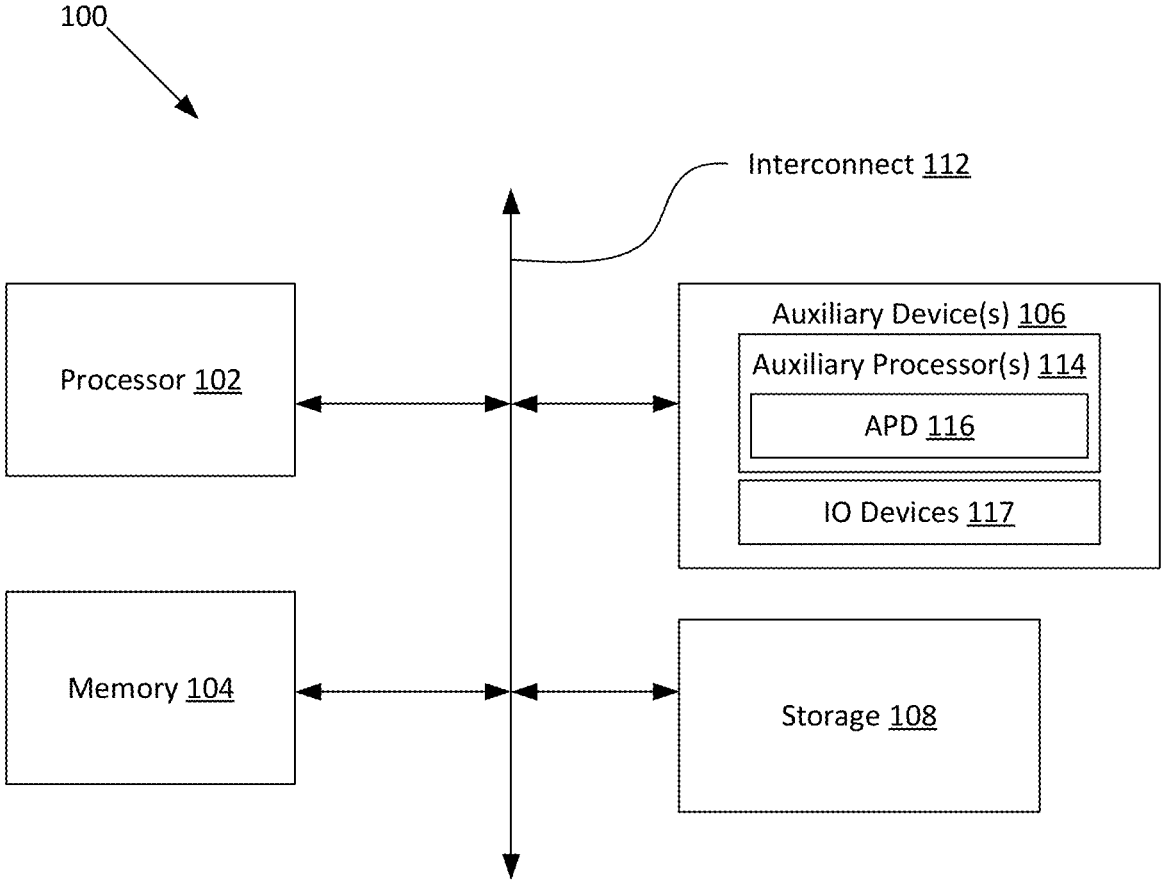
FIG. 1 is a block diagram of an example computing device in which one or more features of the disclosure can be implemented.

FIG. 1 is a block diagram of an example computing device 100 in which one or more features of the disclosure can be implemented. In various examples, the computing device 100 is one of, but is not limited to, for example, a computer, a gaming device, a handheld device, a set-top box, a television, a mobile phone, a tablet computer, or other computing device. The device 100 includes, without limitation, one or more processors 102, a memory 104, one or more auxiliary devices 106, and a storage 108. An interconnect 112, which can be a bus, a combination of buses, and/or any other communication component, communicatively links the one or more processors 102, the memory 104, the one or more auxiliary devices 106, and the storage 108.

In various alternatives, the one or more processors 102 include a central processing unit (CPU), a graphics processing unit (GPU), a CPU and GPU located on the same die, or one or more processor cores, wherein each processor core can be a CPU, a GPU, or a neural processor. In various alternatives, at least part of the memory 104 is located on the same die as one or more of the one or more processors 102, such as on the same chip or in an interposer arrangement, and/or at least part of the memory 104 is located separately from the one or more processors 102. The memory 104 includes a volatile or non-volatile memory, for example, random access memory (RAM), dynamic RAM, or a cache.

The storage 108 includes a fixed or removable storage, for example, without limitation, a hard disk drive, a solid state drive, an optical disk, or a flash drive. The one or more auxiliary devices 106 include, without limitation, one or more auxiliary processors 114, and/or one or more input/output ("IO") devices. The auxiliary processors 114 include, without limitation, a processing unit capable of executing instructions, such as a central processing unit, graphics processing unit, parallel processing unit capable of performing compute shader operations in a single-instruction-multiple-data form, multimedia accelerators such as video encoding or decoding accelerators, or any other processor. Any auxiliary processor 114 is implementable as a programmable processor that executes instructions, a fixed function processor that processes data according to fixed hardware circuitry, a combination thereof, or any other type of processor.

The one or more auxiliary devices 106 includes an accelerated processing device ("APD") 116. The APD 116 may be coupled to a display device, which, in some examples, is a physical display device or a simulated device that uses a remote display protocol to show output. The APD 116 is configured to accept compute commands and/or graphics rendering commands from processor 102, to process those compute and graphics rendering commands, and, in some implementations, to provide pixel output to a display device for display. As described in further detail below, the APD 116 includes one or more parallel processing units configured to perform computations in accordance with a single-instruction-multiple-data ("SIMD") paradigm. Thus, although various functionality is described herein as being performed by or in conjunction with the APD 116, in various alternatives, the functionality described as being performed by the APD 116 is additionally or alternatively performed by other computing devices having similar capabilities that are not driven by a host processor (e.g., processor 102) and, optionally, configured to provide graphical output to a display device. For example, it is contemplated that any processing system that performs processing tasks in accordance with a SIMD paradigm may be configured to perform the functionality described herein. Alternatively, it is contemplated that computing systems that do not perform processing tasks in accordance with a SIMD paradigm perform the functionality described herein.

The one or more IO devices 117 include one or more input devices, such as a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals), and/or one or more output devices such as a display device, a speaker, a printer, a haptic feedback device, one or more lights, an antenna, or a network connection (e.g., a wireless local area network card for transmission and/or reception of wireless IEEE 802 signals).

Figure 2:
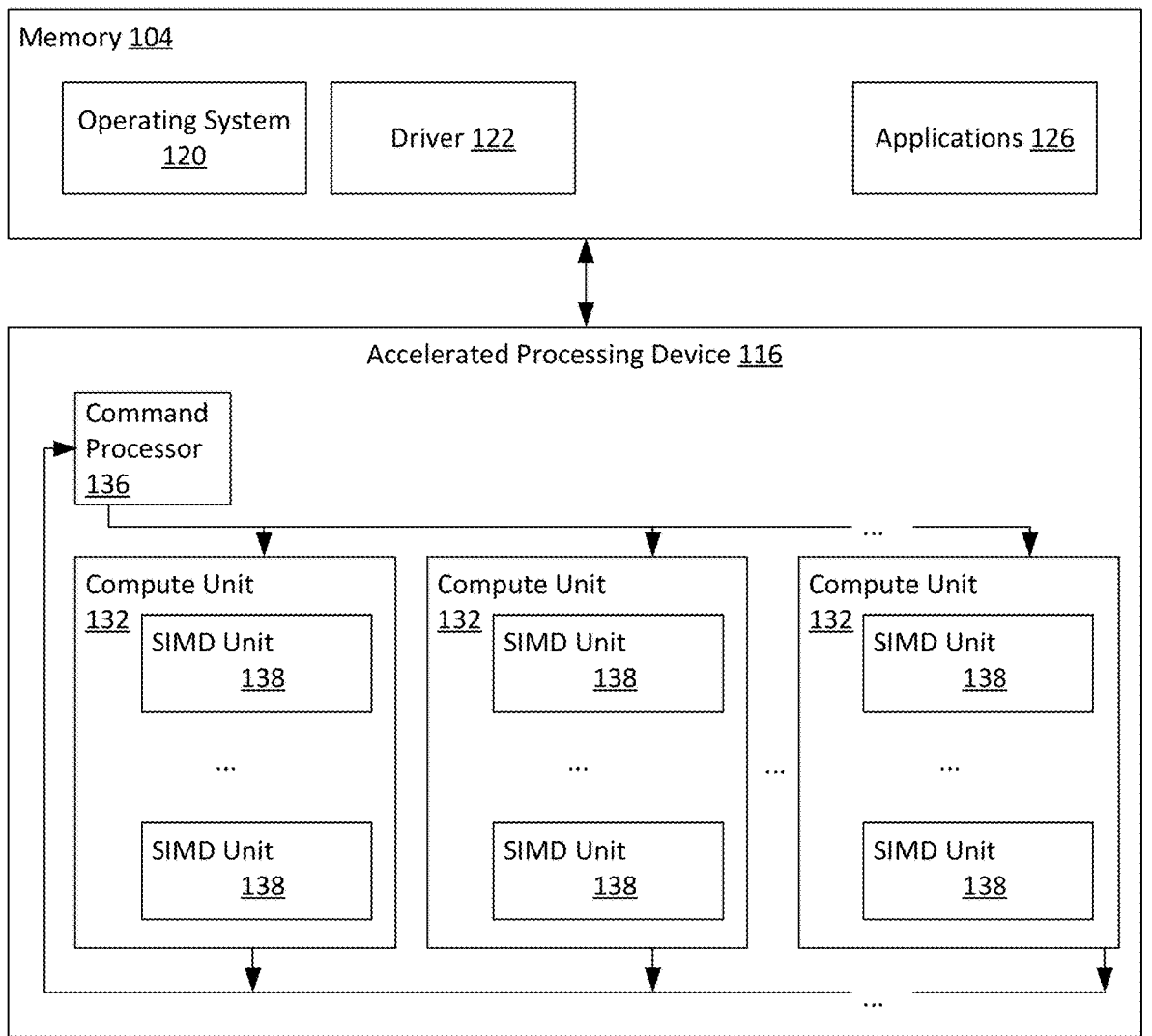
FIG. 2 illustrates details of the device of FIG. 1 and an accelerated processing device, according to an example.

FIG. 2 illustrates details of the device 100 and the APD 116, according to an example. The processor 102 (FIG. 1) executes an operating system 120, a driver 122 ("APD driver 122"), and applications 126, and may also execute other software alternatively or additionally. The operating system 120 controls various aspects of the device 100, such as managing hardware resources, processing service requests, scheduling and controlling process execution, and performing other operations. The APD driver 122 controls operation of the APD 116, sending tasks such as graphics rendering tasks or other work to the APD 116 for processing. The APD driver 122 also includes a just-in-time compiler that compiles programs for execution by processing components (such as the SIMD units 138 discussed in further detail below) of the APD 116.

The APD 116 executes commands and programs for selected functions, such as graphics operations and non-graphics operations that may be suited for parallel processing. The APD 116 can be used for executing graphics pipeline operations such as pixel operations, geometric computations, and rendering an image to a display device based on commands received from the processor 102. The APD 116 also executes compute processing operations that are not directly related to graphics operations, such as operations related to video, physics simulations, computational fluid dynamics, or other tasks, based on commands received from the processor 102.

The APD 116 includes compute units 132 that include one or more SIMD units 138 that are configured to perform operations at the request of the processor 102 (or another unit) in a parallel manner according to a SIMD paradigm. The SIMD paradigm is one in which multiple processing elements share a single program control flow unit and program counter and thus execute the same program but are able to execute that program with different data. In one example, each SIMD unit 138 includes sixteen lanes, where each lane executes the same instruction at the same time as the other lanes in the SIMD unit 138 but can execute that instruction with different data. Lanes can be switched off with predication if not all lanes need to execute a given instruction. Predication can also be used to execute programs with divergent control flow. More specifically, for programs with conditional branches or other instructions where control flow is based on calculations performed by an individual lane, predication of lanes corresponding to control flow paths not currently being executed, and serial execution of different control flow paths allows for arbitrary control flow.

The basic unit of execution in compute units 132 is a work-item. Each work-item represents a single instantiation of a program that is to be executed in parallel in a particular lane. Work-items can be executed simultaneously (or partially simultaneously and partially sequentially) as a "wavefront" on a single SIMD processing unit 138. One or more wavefronts are included in a "work group," which includes a collection of work-items designated to execute the same program. A work group can be executed by executing each of the wavefronts that make up the work group. In alternatives, the wavefronts are executed on a single SIMD unit 138 or on different SIMD units 138. Wavefronts can be thought of as the largest collection of work-items that can be executed simultaneously (or pseudo-simultaneously) on a single SIMD unit 138. "Pseudo-simultaneous" execution occurs in the case of a wavefront that is larger than the number of lanes in a SIMD unit 138. In such a situation, wavefronts are executed over multiple cycles, with different collections of the work-items being executed in different cycles. A command processor 136 is configured to perform operations related to scheduling various workgroups and wavefronts on compute units 132 and SIMD units 138.

The parallelism afforded by the compute units 132 is suitable for graphics related operations such as pixel value calculations, vertex transformations, and other graphics operations. Thus in some instances, a graphics pipeline 134, which accepts graphics processing commands from the processor 102, provides computation tasks to the compute units 132 for execution in parallel.

The compute units 132 are also used to perform computation tasks not related to graphics or not performed as part of the "normal" operation of a graphics pipeline 134 (e.g., custom operations performed to supplement processing performed for operation of the graphics pipeline 134). An application 126 or other software executing on the processor 102 transmits programs that define such computation tasks to the APD 116 for execution.

Within the device, there are many processors (e.g., processor 102, APD 116, or other processors not shown) and many memories (e.g., memory 104, global memory for the APD 116, memory local to the compute units 132, or other memories) that the processors use to store data. For various reasons, memory used to store the results or inputs to calculations consumes a large amount of power. It would be beneficial to save some of such power in instances in which not all of the functionality of a memory is needed. Thus, techniques are provided herein for powering down portions of a memory in some instances, to reduce power consumption while having minimal impact on the results of such calculations.

Figure 3:
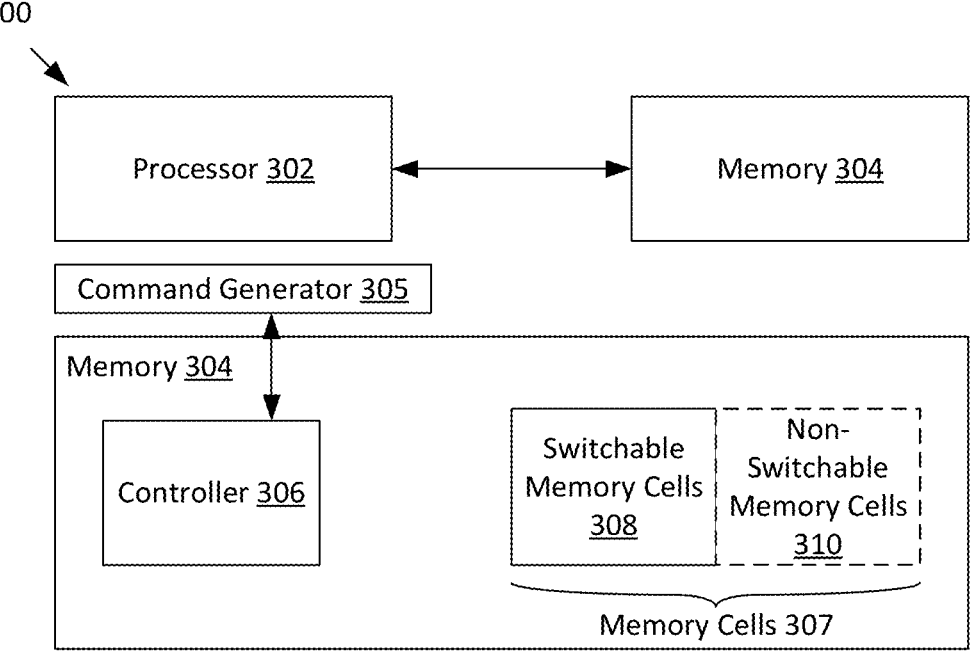
FIG. 3 illustrates a system including a processor and a memory, according to an example.

FIG. 3 illustrates a system 300 including a processor 302 and a memory 304, according to an example. Again, the processor can be any type of processor (including or implemented as appropriate circuitry), such as a programmable processor, a fixed-function processor, a configurable logic processor, or any other type of processor or circuitry. The memory 304 is any type of memory accessible to the processor 302. The memory 304 includes a memory controller 306 and memory cells 307. The memory cells 307 include switchable memory cells 308 and non-switchable memory cells 310. The controller 306 is capable of switching on or off memory cells of the non-switchable memory cells 310. When switched off, a switchable memory cell 308 does not store data and thus does not perform an action in response to a request such as a request to store data or a request to load data. When switched on, a switchable memory cell 308 operates normally, storing data and providing data in response to a load. A switchable memory cell 308 consumes less power than a non-switchable memory cell 310 when the switchable memory cell 308 is powered off.

In general, the controller 306 controls the switchable memory cells 308 in response to commands to control the switchable memory cells 308. In some examples, such commands originate in the controller 306 itself. In other examples, a processor such as the processor 302 generates such commands and sends those commands to the memory 304. A command generator 305 is shown. This is the entity that generates the commands to the controller 306. The command generator 305 represents hardware and/or software that is executed to generate the commands for the controller 306. In various examples, the command generator 305 is, is part of, or executes on the processor 302 or any other processor such as the processor 102 or the APD 116.

In some examples, the commands specify which switchable memory cells 308 to switch off and which memory cells to switch on. In response, the controller 306 executes those commands, switching off the switchable memory cells 308 specified to be switched off and/or switching on the switchable memory cells 308 specified to be switched on.

In some examples, the command generator 305 determines that power consumed by the memory 304 should be reduced and/or determines which switchable memory cells 308 should be turned off. In response to such a determination, the command generator 305 generates commands to switch off the switchable memory cells 308. In some examples, the command generator 305 maintains a power budget amount for the memory 304 and makes a determination of which memory cells 308 should be on and which should be switched off based on the power budget. In some examples, the command generator 305 prioritizes some memory cells 308 to switch off based on the type of data being stored in the memory cells 308. In some examples, the command generator 305 includes logic for performing such prioritization.

Figure 4:
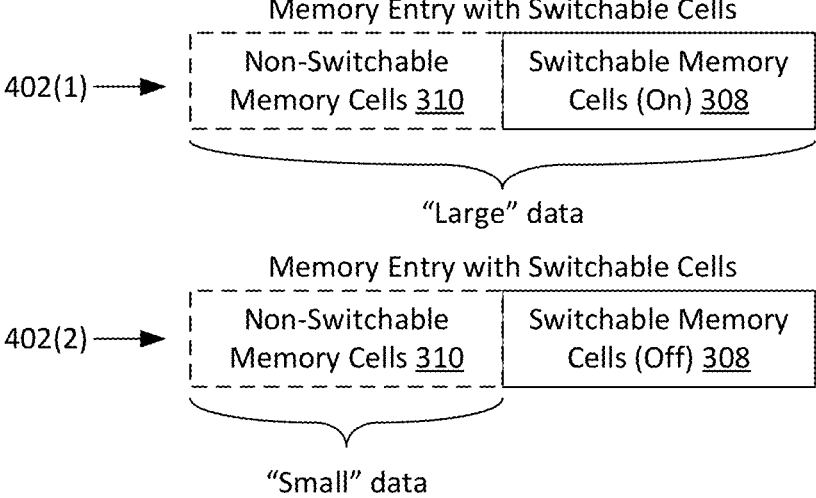
FIG. 4 illustrates switching on or off non-switchable memory cells for a memory entry, according to an example.

FIG. 4 illustrates switching on or off non-switchable memory cells 308 for a memory entry 402, according to an example. The memory entry 402 includes non-switchable memory cells 308 and switchable memory cells 310. Moreover, the memory entry 402 represents memory cells that, together, make up a larger data value such as a byte, a word, or another value (e.g., a 32-bit, 64-bit, or larger-bit data value). It can be seen that switching the non-switchable memory cells 308 of a memory entry 402 off reduces power consumption while also shrinking the size of data values represented by the memory entries 402.

Two examples states for a memory entry 402 are shown. In a first state, memory entry 402(1), the switchable memory cells 310 are on. Thus the memory entry 402(1) represents a "large" data value. By contrast, in a second state, memory entry 402(2), the switchable memory cells 310 are off. Thus, the memory entry 402(2) represents a "small" data value.

In some examples, entire memory entries 402 can be switched on or off. In such instances, the data values for those memory entries 402 would not be stored, and no such data could be loaded from memory.

In some examples, each memory entry 402 of a set of memory entries 402 is associated with a particular item of data for a particular workload. The command generator 305 analyzes the content processed by the workload and decides which switchable memory cells 308 to switch on or off. The command generator 305 knows which memory cells 308 are associated with which items of data for the workload and also knows which items of data for the workload to prioritize. The command generator 305 then selects switchable memory cells 308 with the lowest priority to switch off. Information regarding priority can be provided in any technically feasible manner, such as through metadata received from an application, operating system, software, or hardware device. The priority information indicates what data should be prioritized for the purpose of switching the cells off. The command generator 305 can adjust how many cells 308 are powered off based on an available power budget (e.g., selecting a number of cells 308 that would consume up to but not greater than the power budget). In various examples, a system controller informs the command generator 305 of this power budget, which is based on operating conditions of the device.

In some examples, the command generator 305 controls the switchable memory cells 308 in a dynamic manner, as the power budget and/or workload data changes. In an example, the command generator 305 observes or processes the data over time and generates priorities for the data based on the observation or processing. Then, the command generator 305 generates commands to adjust the switchable memory cells 308 in accordance with the new priorities. In some examples, if the new priorities indicate that a cell 308 should remain in its current state, then the command generator 305 does not generate commands for such a cell 308 and if the new priorities indicate that a cell 308 should change state (e.g., switch off while in an on state or switch on while in an off state), then the command generator 305 generates commands to change the state of the cell 308 accordingly.

Herein, it is stated that the controller 306 switches on or off memory cells. In some examples, this switching occurs in any technically feasible manner such as using power gating. In other examples, the controller 306 performs an action other than turning the power on or off for the memory cell 308. In an example, the controller 306 causes the switchable memory cells 308 to consume less power by running the entire memory at a lower voltage than specified by the specification of the memory, with cells that are "important" afforded an error check and correction ("ECC") mechanism. An indication that a switchable memory cell 308 is powered down refers to any action that reduces the power of a switchable memory cell 308, such as powering that memory cell off, switch off ECC, or performing another action that reduces the power consumption of a switchable memory cell 308. An indication that a switchable memory cell 308 is powered up refers to an opposite action.

One application of the technique described herein, in which switchable memory cells 308 are powered down to accommodate a power budget, is in the context of video encoding and/or decoding. Additional details follow.

Figure 5A:
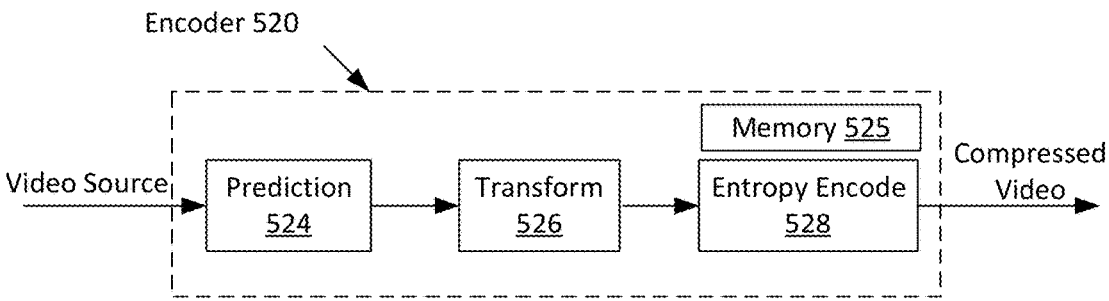
FIG. 5A presents a detailed view of a video encoder, according to an example.

FIG. 5A presents a detailed view of a video encoder 520, according to an example. The video encoder 520 accepts source video, encodes the source video to produce compressed video (or "encoded video"), and outputs the compressed video. Embodiments of the encoder 520 may include blocks other than those shown. The encoder 520 includes a pre-encoding analysis block, a prediction block 524, a transform block 526, and an entropy encode block 528. In some alternatives, the encoder 520 implements one or more of a variety of known video encoding standards (such as MPEG2, H.264, or other standards), with the prediction block 524, transform block 526, and entropy encode block 528 performing respective portions of those standards. In other alternatives, the encoder 520 implements a video encoding technique that is not a part of any standard.

The prediction block 524 performs prediction techniques to reduce the amount of information needed for a particular frame. Various prediction techniques are possible. One example of a prediction technique is a motion prediction based inter-prediction technique, where a block in the current frame is compared with different groups of pixels in a different frame until a match is found. Various techniques for finding a matching block are possible. One example is a sum of absolute differences technique, where characteristic values (such as luminance) of each pixel of the block in the current block is subtracted from characteristic values of corresponding pixels of a candidate block, and the absolute values of each such difference are added. This subtraction is performed for a number of candidate blocks in a search window. The candidate block with a score deemed to be the "best," such as by having the lowest sum of absolute differences, is deemed to be a match. After finding a matching block, the current block is subtracted from the matching block to obtain a residual. The residual is further encoded by the transform block 526 and the entropy encode block 528 and the block is stored as the encoded residual plus the motion vector in the compressed video.

The transform block 526 performs an encoding step which is typically lossy, and converts the pixel data of the block into a compressed format. An example transform that is typically used is a discrete cosine transform (DCT). The discrete cosine transform converts the block into a sum of weighted visual patterns, where the visual patterns are distinguished by the frequency of visual variations in two different dimensions. The weights afforded to the different patterns are referred to as coefficients. These coefficients are quantized and stored together as the data for the block. Quantization is the process of assigning one of a finite set of values to a coefficient. The total number of values that are available to define the coefficients of any particular block is defined by the quantization parameter (QP). A higher QP means that the step size between values having unity increment is greater, which means that a smaller number of values are available to define coefficients. A lower QP means that the step size is smaller, meaning that a greater number of values are available to define coefficients. A lower QP requires more bits to store, because more bits are needed for the larger number of available coefficient values, and a lower QP requires fewer bits. Visually, a higher QP is associated with less detail and a lower QP is associated with more detail. Although the concept of QP is defined herein, the term "quality value" is sometimes used herein to generally refer to a value indicating the amount of data afforded for encoding a block, and thus the visual quality with which a block is represented in the encoded video. Numerically, quality value can be thought of as a ranking. Thus, a higher quality value means that a block is afforded a lower number of bits and is thus encoded with lower quality and a lower quality value means that a block is afforded a higher number of bits and is thus encoded with higher quality. It should be understood that although quality values are described herein as a "ranking" (with a lower number meaning higher quality and a higher number meaning lower quality), it is possible for other types of quality values to be used. For example, it is possible to use quality values where a higher number means a higher quality and a lower number means a lower quality. In some situations, the term quantization parameter is used herein. Any instance of that term can be replaced with the term "quality value."

The entropy encode block 528 performs entropy coding on the coefficients of the blocks. Entropy coding is a lossless form of compression. Examples of entropy coding include context-adaptive variable-length coding and context-based adaptive binary arithmetic coding. The entropy coded transform coefficients describing the residuals, the motion vectors, and other information such as per-block QPs are output and stored or transmitted as the encoded video.

A pre-encoding analysis block performs analysis on the source video to adjust parameters used during encoding. One operation performed by the pre-encoding analysis block includes analyzing the source video to determine what quality values should be afforded to the blocks for encoding. Additional details about determining quality values for encoding blocks are provided below.

Figure 5B:
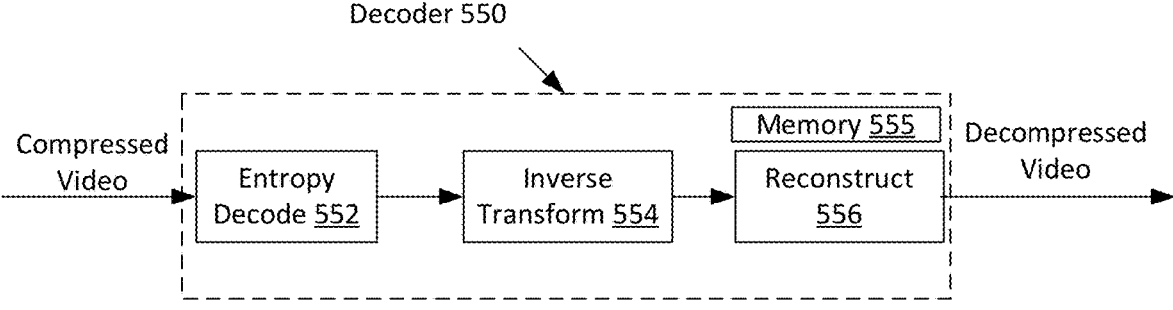
FIG. 5B represents a decoder for decoding compressed data generated by an encoder such as the encoder, according to an example.

FIG. 5B represents a decoder 550 for decoding compressed data generated by an encoder such as the encoder 520, according to an example. The decoder 560 includes an entropy decoder 552, an inverse transform block 554. The entropy decoder 552 converts the entropy encoded information in the compressed video, such as compressed quantized transform coefficients, into raw (non-entropy-coded) quantized transform coefficients. The inverse transform block 554 converts the quantized transform coefficients into the residuals. The reconstruct block 556 obtains the predicted block based on the motion vector and adds the residuals to the predicted block to reconstruct the block.

Note that the operations described for FIGS. 5A and 5B only represent a small subset of the operations that encoder and decoders may use.

In various examples, the encoder 520 and/or decoder 550 are implemented within the device 100. In an example, either or both of the encoder 520 and decoder 550 are any of software executing on a processor such as the processor 102 or the APD 116, hardware (e.g., circuitry) such as a processor of any type (e.g., a fixed function analog or digital processor, a programmable processor, a configurable logic array), or any other type of hardware, or a combination of software and hardware. In some examples, the device 100 includes an encoder 520, a decoder 550, or both the encoder 520 and decoder 550.

As stated above, it is possible to use the technique of powering down one or more memory cells in the context of video encoding or decoding. In some examples, an encoder has an internal memory 525 and/or a decoder 550 has an internal memory 555. In some examples, the encoder stores working data (e.g., data involved in the encoding, such as in the prediction 524, transform 526, and entropy encode 528 operations) in the memory 525 and/or a different memory such as memory 104, memory of the APD 116, or other memory. In some examples, the decoder stores working data (e.g., data involved in the decoding, such as in the entropy decode 552, inverse transform 554, and reconstruct 556 operations) in the local memory 555 and/or a different memory such as memory 104, a memory of the APD 116, or in another memory.

In some instances, the memory 304 of FIG. 3 is one or more of the memories that store working data for the encoder 520 and/or decoder 550. Thus, in various examples, a command generator 305 generates one or more commands to control (e.g., power up or down) the switchable memory cells 308 of a memory that stores working data for the encoder 520 and/or decoder 550. In various examples, the command generator 305 generates these commands based on priority information that indicates which portions of a frame (e.g., which blocks) are prioritized as compared with which other portions (e.g., which other blocks). In an example, the command generator 305 establishes priorities for a plurality of blocks, powers down blocks having a priority below a threshold, and powers up blocks having a priority above the threshold.

In some examples, the command generator 305 establishes the priorities based on the content of the blocks. In an example, the command generator 305 determines perceptual importances of blocks, compares the perceptual importances, and assigns the priorities based on the perceptual importances. In some examples, blocks with higher perceptual importance are afforded higher priority than blocks with lower perceptual importance.

In some examples, the command generator 305 or another entity determines quantization parameters for each of the blocks. As the quantization parameters determine how much data is to be afforded each block, the number of bits required for a block encoded with a lower quantization parameter is greater than the number of bits required for a block with a higher quantization parameter. Further, in some examples, each block of a plurality of blocks is assigned a fixed set of memory cells 307, with at least some such memory cells being switchable memory cells 308. For blocks having a higher quantization parameter (and thus requiring less data), the command generator 305 sends commands to power down one or more switchable memory cells 308 for such blocks. For blocks having a lower quantization parameter (and thus requiring less data), the command generator 305 sends commands to power down fewer switchable memory cells 308 as compared with the blocks having a higher quantization parameter. As can be seen, in some examples, the command generator 305 powers up or down memory cells that store data for blocks being processed by an encoder 520 and/or decoder 550, based on the quantization parameters for those blocks.

In some examples, the command generator 305 determines a measure referred to as a plain macroblock percentage. The plain macroblock percentage is the percentage of macroblocks of an image that are considered to be "plain."

A macroblock is a portion of an image (e.g., a tile, such as a 16×16 tile). A macroblock is considered "plain" if the variance of the luminance of the pixels in that macroblock is below a threshold. The variance of the luminance of a macroblock is the square of the standard deviation of the luminance. Specifically, the variance is equal to the (sum of the square of the difference between the luminance and the average luminance for each pixel) divided by the number of pixels. Put differently, the variance is equal to a sum divided by the number of pixels, where the sum is the sum, over all pixels of the macroblock, of the square of a difference value for the pixel. The difference value is the difference between the luminance for the pixel and the average luminance for the macroblock. The luminance is the "brightness" of a pixel, and can be determined in any technically feasible manner. The command generator 305 generates commands to switch on or off memory cells 308 based on the plain macroblock percentage. In some examples, the command generator 305 powers down memory cells for macroblocks that are considered plain (e.g., variance of luminance less than or equal to a threshold) and powers up memory cells for macroblocks that are not plain (e.g., variance of luminance greater than the threshold). Again, powering down the memory cells, in some examples, results in a lower number of bits used for the calculations for a macroblock (e.g., through reduced calculation precision or through some other means). In some examples, macroblocks considered plain are afforded a quantization parameter offset that results in a reduction of the amount of data that is used as compared with if the offset were not applied. This reduction results in a smaller number of bits required for calculations (e.g., required for the coefficients of the transform stage), meaning that memory cells for those calculations (e.g., memory cells involved in transform calculations) are, in some examples, powered down. In some examples, the device 100 or a different device employs an artificial intelligence ("AI") system to determine a macroblock percentage threshold that determines which macroblocks to power down memory cells for. In some examples, the device 100 or a different device employs an artificial intelligence system to generate an AI model that is configured to detect regions of interest in a video. A region of interest is a portion of a frame that is classified as being "more important" than non-region of interest portions, where this classification is performed by, for example, an AI system or an algorithm.

In some examples, an encoder 520 performs region of interest analysis to determine a region of interest for a frame. Then, the encoder 520 applies a QP bias to previously-determined QP values for the blocks of the frame in order to increase the amount of information used for blocks that are part of the region of interest and/or decrease the amount of information used for blocks that are not part of the region of interest. In some examples, the encoder 520 saves bandwidth by reducing the amount of data that is encoded by only encoding in the region of interest or by reducing the amount of data needed for areas outside of the region of interest.

In some examples, for video encoding and decoding, a memory entry 402 corresponds to information (such as a set of DCT coefficients for the transform step) for a block. In such examples, the controller 306 determines the QP for a block (entry 402) and powers up or down the memory cells for the block based on that QP. As described above, since a higher QP requires fewer bits, more memory cells can be powered off for a higher QP than for a lower QP. Thus, in one example, for a first block having a first QP, the controller 306 powers down a first number of memory cells, and for a second block having a second QP that is higher than the first QP, the controller 306 powers down a second number of memory cells that is greater than the first number of memory cells. As stated above, the QP can be determined in any technically feasible manner, and in some examples, region of interest and/or "plain macroblock" analysis is used to adjust the QP. In summary, in some examples, the "entry" for video encoding comprises a set of values (e.g., DCT coefficients) for a block and the QP for the block determines the degree to which the memory cells of that entry can be powered on or off. Above, it is stated that a "priority" determines the degree to which the controller 306 powers down memory cells. In the case of video encoding, the "priority" is the QP for a block.

Another example use case for the switchable memory cell mechanism described above is for hardware that performs artificial neural network operations. In an example, an artificial neural network includes a set of artificial neurons that have connections therebetween. An input is processed through a first layer of neurons which provide an output to a subsequent layer, and so on. Connections between neurons have weights that are applied to the outputs of previous layers (or the input) to generate inputs for the next layers (or the output). In some examples, the command generator 305 identifies weights, one or more layer inputs, and/or one or more layer outputs that do not require the full precision available to the neural network and powers down one or more switchable memory cells 308 that store at least a portion of the data for such values that do not require that full precision. In one example, the command generator 305 identifies weights of an AI model using a heuristic, a trained AI model (e.g., a different trained AI model), or through any other technically feasible mechanism, and powers down one or more switchable memory cells 308 that store the identified weights. The weights identified are those that do not significantly impact the output of the AI model. In some examples, the command generator 305 analyzes one or more aspects of the inputs to the AI operation to determine which weights can have values powered down. In another example, the command generator 305 powers down one or more values for the inputs or outputs of the AI model.

In another application, the command generator 305 responds to requests from software (e.g., made via an application programming interface ("API")). More specifically, software such as an application or driver executing within a device such as the device 100 maintains data in the memory 304. The software also knows the fault tolerance of that data, meaning that the software is aware of which of the data can be represented with less information (e.g., with reduced precision or eliminated altogether). The software thus instructs the command generator 305 as to which data can have its precision reduced or can be eliminated (thus effectively instructing the command generator 305 as to the "priority" of such data). In an example, the command generator 305 responds to an API command that allows the software to identify which data can have its precision reduced or can be eliminated by switching the power memory cells 308 down for the identified data. In various examples, the API command identifies the data by memory address or through some other mechanism.

Figure 6:
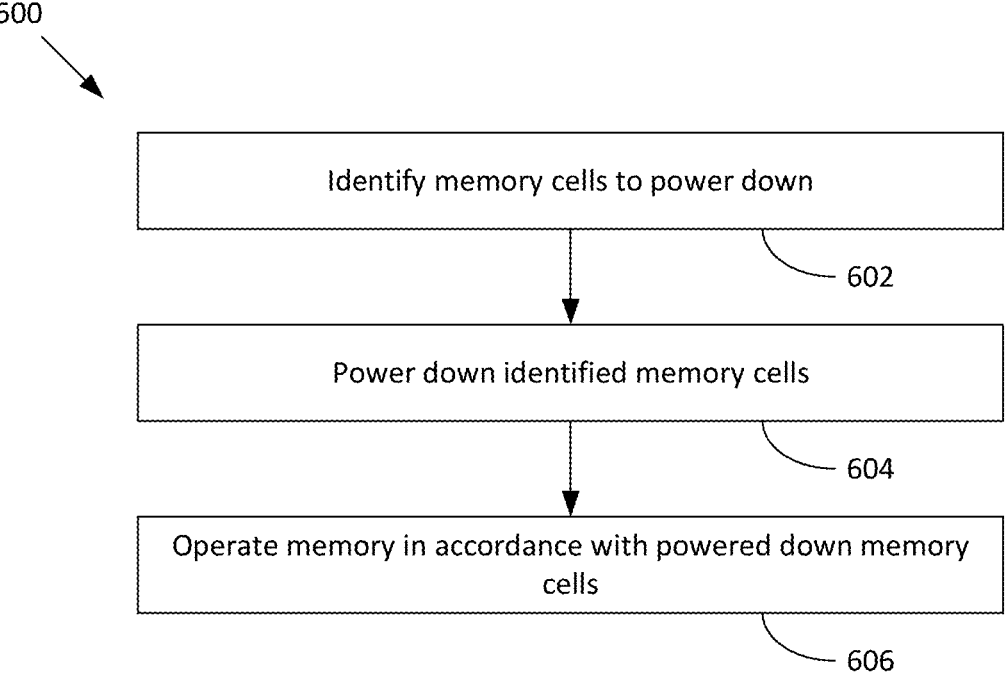
FIG. 6 is a flow diagram of a method for performing processing using a memory having switchable memory cells, according to an example.

FIG. 6 is a flow diagram of a method 600 for performing processing using a memory having switchable memory cells, according to an example. Although described with respect to the system of FIGS. 1-5B, those of skill in the art will recognize that any system configured to perform the steps of the method 600 in any technically feasible order falls within the scope of the present disclosure.

At step 602, a command generator 305 identifies memory cells of a memory 304 to power down. A variety of ways in which the command generator 305 can perform this identification are described herein. In some examples, the command generator 305 knows what workload is being performed in the memory and can analyze the data stored in or to be stored in the memory 304. Based on the analysis, the command generator 305 identifies memory cells to be powered down. In some examples, the workload is video encoding or decoding, or includes artificial intelligence operations such as an inference operation in which inputs are provided to a model which processes the inputs using weights and generates an output. In some examples, the command generator 305 receives requests, e.g., from software via an API, that indicate which data can have memory cells powered down (e.g., as only a reduced precision is needed for the data or the data is completely unneeded).

At step 604, the command generator 305 generates commands to the memory 304 that cause the memory 304 to power down the identified memory cells. In some examples, if the memory cells are already powered down, then the memory 304 does not power those memory cells down (as they are already powered down and thus no action needs to be taken) and if memory cells are not powered down, then the memory 304 does power those memory cells down. In some examples, powering memory cells down includes shutting off the power for the memory cells or reducing the power consumed by the memory cells (e.g., by switching off ECC or through another mechanism).

At step 606, the processor 302 operates with the memory cells powered down. In an example, the processor 302 performs a workload where some data of the workload is assigned to a memory entry having some or all memory cells that are powered down.

It should be understood that many variations are possible based on the disclosure herein. Although features and elements are described above in particular combinations, each feature or element can be used alone without the other features and elements or in various combinations with or without other features and elements.

Each of the units illustrated in the figures represent hardware circuitry configured to perform the operations described herein, software configured to perform the operations described herein, or a combination of software and hardware configured to perform the steps described herein. For example, the processor 102, memory 104, any of the auxiliary devices 106, the storage 108, the command processor 136, compute units 132, command processor 136, SIMD units 138, processor 302, command generator 305, controller 306, encoder 520, including prediction 524, transform 526, and entropy encode 528, and decoder 550, include entropy decode 552, inverse transform 554, and reconstruct 556, are implemented fully in hardware, fully in software executing on processing units, or as a combination thereof. In various examples, any of the hardware described herein includes any technically feasible form of electronic circuitry hardware, such as hard-wired circuitry, programmable digital or analog processors, configurable logic gates (such as would be present in a field programmable gate array), application-specific integrated circuits, or any other technically feasible type of hardware.

The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements aspects of the embodiments.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method comprising:
   identifying memory cells to power down, based on a set of priorities for the memory cells, wherein each memory cell comprises a portion of a memory entry configured to store a data item;
   powering down the identified memory cells in accordance with the set of priorities, resulting in powered down memory cells; and
   performing processing in accordance with the powered down memory cells.

2. The method of claim 1, wherein identifying the memory cells comprises analyzing data of a workload to be performed using the memory cells.

3. The method of claim 2, wherein the workload comprises video encoding or video decoding and the set of priorities for the memory cells correspond to quantization parameters for blocks a frame of video.

4. The method of claim 3, wherein the analyzing comprises setting the quantization parameters based on a determination of one or more regions of interest of a frame of video.

5. The method of claim 1, wherein the set of priorities is specified by an application via an application programming interface.

6. The method of claim 1, wherein powering down the identified memory cells includes switching off error check and correction for the identified memory cells.

7. The method of claim 1, wherein performing the processing includes processing data stored in the memory entry having at least some memory cells that are powered down.

8. The method of claim 7, wherein the memory entry includes a plurality of memory cells that together store an item of data.

9. The method of claim 1, wherein the processing comprises one of performing video encoding, video decoding, or performing processing through an artificial intelligence model.

10. A system comprising:
    a plurality of memory cells; and
    a processor configured to:
       identify memory cells to power down, based on a set of priorities for the memory cells, wherein each memory cell comprises a portion of a memory entry configured to store a data item;

power down the identified memory cells in accordance with the set of priorities, resulting in powered down memory cells; and performing processing in accordance with the powered down memory cells.

11. The system of claim 10, wherein identifying the memory cells comprises analyzing data of a workload to be performed using the memory cells.

12. The system of claim 11, wherein the workload comprises video encoding or video decoding and the set of priorities for the memory cells correspond to quantization parameters for blocks a frame of video.

13. The system of claim 12, wherein the analyzing comprises setting the quantization parameters based on a determination of one or more regions of interest of a frame of video.

14. The system of claim 10, wherein the set of priorities is specified by an application via an application programming interface.

15. The system of claim 10, wherein powering down the identified memory cells includes switching off error check and correction for the identified memory cells.

16. The system of claim 10, wherein performing the processing includes processing data stored in the memory entry having at least some memory cells that are powered down.

17. The system of claim 16, wherein the memory entry includes a plurality of memory cells that together store an item of data.

18. The system of claim 10, wherein the processing comprises one of performing video encoding, video decoding, or performing processing through an artificial intelligence model.

19. A non-transitory computer-readable medium storing instructions that, when executed by a processor, cause the processor to perform operations comprising:

identifying memory cells to power down, based on a set of priorities for the memory cells, wherein each memory cell comprises a portion of a memory entry configured to store a data item;

powering down the identified memory cells in accordance with the set of priorities, resulting in powered down memory cells; and performing processing in accordance with the powered down memory cells.

20. The non-transitory computer-readable medium of claim 19, wherein identifying the memory cells comprises analyzing data of a workload to be performed using the memory cells.

* * * * *